United States Patent
Karlicek, Jr. et al.

(10) Patent No.: US 8,278,190 B2
(45) Date of Patent: Oct. 2, 2012

(54) METHODS OF FORMING LIGHT-EMITTING STRUCTURES

(75) Inventors: Robert F. Karlicek, Jr., Chelmsford, MA (US); Alexei A. Erchak, Billerica, MA (US); Michael Lim, Cambridge, MA (US); Georgiy Seryogin, Belmont, MA (US); Gianni Taraschi, Somerville, MA (US)

(73) Assignee: Luminus Devices, Inc., Billerica, MA (US)

( * ) Notice: Subject to any disclaimer, the term of this patent is extended or adjusted under 35 U.S.C. 154(b) by 851 days.

(21) Appl. No.: 12/130,899

(22) Filed: May 30, 2008

(65) Prior Publication Data

US 2009/0035885 A1 Feb. 5, 2009

Related U.S. Application Data

(60) Provisional application No. 60/932,214, filed on May 30, 2007.

(51) Int. Cl.
*H01L 21/00* (2006.01)

(52) U.S. Cl. ........................................ 438/460; 438/462

(58) Field of Classification Search ................ 438/460, 438/462

See application file for complete search history.

(56) References Cited

U.S. PATENT DOCUMENTS

| 6,027,989 A * | 2/2000 | Poole et al. ............... 438/522 |
| 6,071,795 A | 6/2000 | Cheung et al. |
| 6,225,193 B1 * | 5/2001 | Simpson et al. ............ 438/460 |
| 6,420,242 B1 | 7/2002 | Cheung et al. |
| 6,559,075 B1 | 5/2003 | Kelly et al. |
| 6,831,302 B2 | 12/2004 | Erchak et al. |
| 7,341,880 B2 | 3/2008 | Erchak et al. |
| 7,344,903 B2 | 3/2008 | Erchak et al. |
| 7,521,273 B2 | 4/2009 | Erchak et al. |
| 7,799,585 B2 | 9/2010 | Erchak et al. |
| 2004/0259279 A1 | 12/2004 | Erchak et al. |
| 2006/0054897 A1 * | 3/2006 | Yu et al. ..................... 257/79 |
| 2007/0085098 A1 | 4/2007 | Erchak et al. |
| 2008/0241978 A1 | 10/2008 | Erchak et al. |
| 2008/0248602 A1 | 10/2008 | Erchak et al. |
| 2008/0274574 A1 | 11/2008 | Yun |
| 2009/0023239 A1 | 1/2009 | Erchak et al. |

FOREIGN PATENT DOCUMENTS

WO  WO 2004/093142  10/2004
WO  WO 2006/023088  3/2006

* cited by examiner

*Primary Examiner* — Jae Lee
(74) *Attorney, Agent, or Firm* — Wolf, Greenfield & Sacks, P.C.

(57) ABSTRACT

Methods of forming light-emitting structures, as well as related devices and/or systems are described. In some cases, the methods utilize a layer transfer and/or layer separation step(s) used to form such structures.

15 Claims, 4 Drawing Sheets

METHODS OF FORMING LIGHT-EMITTING STRUCTURES

RELATED APPLICATIONS

This application claims priority to U.S. Provisional Patent Application Ser. No. 60/932,214 filed on May 30, 2007 which is incorporated herein by reference.

FIELD OF INVENTION

The present embodiments are drawn generally to methods of forming light-emitting structures, as well as related devices and/or systems, and more specifically to methods that utilize a layer transfer and/or layer separation step(s) used to form such structures.

BACKGROUND

A light-emitting diode (LED) is an example of a common light emitting device. LEDs can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers). LEDs also generally include contact structures (also referred to as electrical contact structures or electrodes), which are features on a device that may be electrically connected to a power source. The power source can provide current to the device via the contact structures, e.g., the contact structures can deliver current along the lengths of structures to the surface of the device within which energy can be converted into light.

The multiple layers described above may be formed on a substrate. In some cases where the substrate is not necessary for the proper functioning of the device, it may be desirable to separate the substrate from the device and reuse it in subsequent processes and/or devices. In other cases, removal of the substrate from the device may be useful for light emission. Accordingly, such methods that accomplish this affect can be useful.

SUMMARY OF INVENTION

Methods of forming light-emitting structures as well as related devices and systems are described.

In one aspect, a method is provided. The method comprises providing a material structure comprising an n-type region, a p-type region, and a light-generating region between the n-type region and the p-type region. The method further comprises implanting ions in the material structure and forming gas regions from the ions implanted in the material structure. The method further comprises separating a first portion of the material structure from a second portion of the material structure, in part, due to formation of the gas regions.

In another aspect, a method is provided. The method comprises providing a material structure, forming a patterned mask on a surface of the material structure and implanting ions through the surface into the material structure. The method further comprises forming gas regions from the ions implanted in the material structure and separating a first portion of the material structure from a second portion of the material structure, in part, due to formation of the gas regions.

In another aspect, a method is provided. The method comprises providing a material structure comprising an n-type region, a p-type region, and a light-generating region between the n-type region and the p-type region. The method further comprises implanting ions into the material structure and forming gas regions from the ions implanted in the material structure. The method further comprises separating a first portion of the material structure from a second portion of the material structure, in part, due to formation of the gas region and forming a submount on the first portion.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Figure 1:
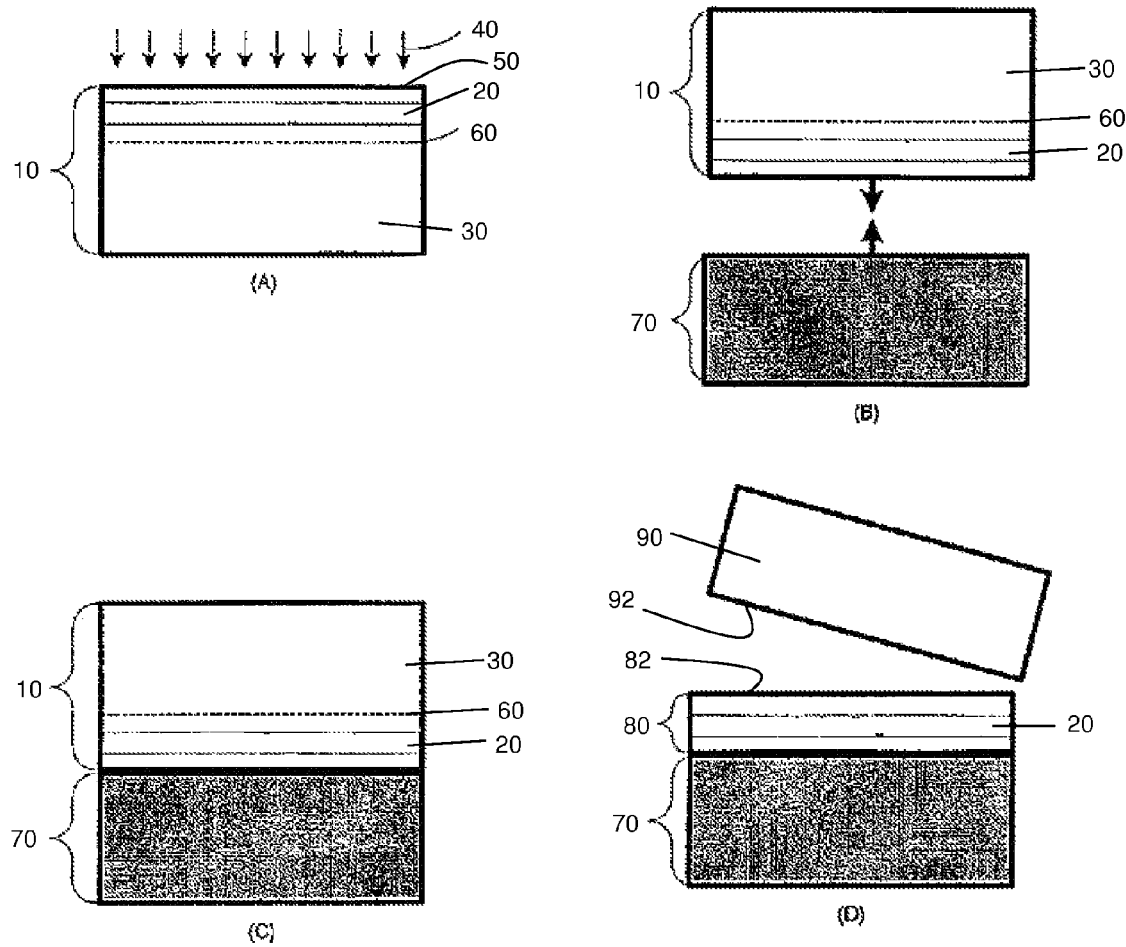
FIGS. 1A-D schematically illustrate a method according to some embodiments.

Methods of forming light-emitting structures are described. In some embodiments, the material structures described herein may include a functional portion (e.g., that includes a light-emitting region) and a non-integral portion that can be absent from the final device while maintaining its functionality (e.g., a substrate on which the functional region is fabricated). The methods can involve implanting ions into a material structure. After implantation, the ions may coalesce (e.g., as the result of heating the material structure) to form gas regions. The formation of gas regions within the structure can promote separation of one portion of the structure from another portion of the structure. One of the portions may be further processed to form a light-emitting device, while the other portion (e.g., a substrate) may be re-used or discarded. In some embodiments, a mask is formed on the surface of the material structure through which ion implantation occurs. In such cases, ions may be implanted at varying depths within the material structure. This can lead to formation of a textured (e.g., roughened and/or patterned) surface on one of the portions upon separation of the two portions. Additionally, some embodiments include the formation of a submount on the functional region after separation.

In some cases, the layer transfer process may be used to separate a light-emitting portion from an underlying substrate (e.g., GaN-on-sapphire, bulk GaN substrate). Such a process is illustrated in FIGS. 1A-1D which represent cross-sections of the structure after different process steps. In FIG. 1A, a material structure 10 comprises an active region 20 formed on a substrate 30. As described further below, ions 40 are implanted into the structure through a top surface 50.

The active region may comprise, for example, a p-type region, an n-type region, and/or a light-generating region. In some embodiments, the active region comprises a light-generating region between an n-type region and a p-type region. The active region may comprise materials such as, for example, GaN, InGaN, and/or AlGaN. In some embodiments, the active region may comprise one or more region(s) arranged in layer(s). The layer(s) in the active region may have a thickness of, for example, less than about 1.0 micron (e.g., less than 750 nm, less than 500 nm, less than 250 nm).

Substrate 30 may comprise a variety of materials including, but not limited to, sapphire, group-III nitride materials (e.g., GaN, AlGaN, InGaN, etc.), diamond, silicon, among others. In some embodiments, the donor wafer can include a GaN-on-sapphire substrate. In some embodiments, the donor wafer can include a bulk GaN substrate. In some embodiments, the donor wafer can include a bulk AlN substrate. In some embodiments, one or more layers can be epitaxially grown on a starting donor substrate (e.g., a GaN-on-sapphire substrate, a bulk GaN substrate, a bulk AlN substrate) to form, for example, light-emitting device layers, p-type layer(s), n-type layer(s), etc.

Ions 40 are implanted into the material structure using, for example, standard ion implantation techniques. Suitable ions for use in the embodiments described herein are capable of coalescing to form a gas (e.g., in the form of a gaseous region) as described further below. Such ions include, but are not limited to, hydrogen, helium, and argon, among others.

In some cases, ions may be implanted into the material structure through the active region (e.g., through the n-type region, p-type region, and/or the light-generation region). The concentration of the ions may form a "peak" (i.e., a maximum concentration) at a distance below the surface through which the ions were implanted. In some instances, the ions may form a peak 60 located below the active region (e.g., quantum wells of a light-emitting multi-layer structure), as shown in FIG. 1A. As examples, the ions may form a peak depth, for example, at about 0.5 microns, about 1.0 microns, or about 5.0 microns below surface 50. In some cases, the ions may form a peak depth at about 0.5 microns, about 1.0 microns, or about 5.0 microns below active region 20.

In some embodiments, material structure 10 may be bonded to handle wafer 70, as shown in FIG. 1B. It should be understood that this is an optional step. The material structure and handle wafer may be bonded using suitable methods known in the art including, for example wafer bonding (e.g., anodic bonding, fusion bonding, etc.), glass frit bonding, among others. An exemplary illustration of the resulting wafer bonded pair is shown in FIG. 1C.

After the ions have been implanted, gas regions comprising the ions may be formed within the material structure. Gas regions may be formed, for example, as a result of annealing the material structure to a temperature at which gas bubbles form from the implanted ions. The temperature may depend on the type of ions implanted. In some embodiments, the formation of gas regions occurs at temperatures greater than about 400 degrees C. (e.g., greater than about 500 degrees C., greater than about 600 degrees C., greater than 700 degrees C.). In some cases, gas regions may form due to the exposure of the material structure to electromagnetic radiation (e.g., one or more lasers, UV radiation, etc.). The gas regions may, in some cases, form at the location of the peak ion concentration. The formation of the gas regions may lead to structural damage of material structure 10 in the original locations of the ions and/or the locations where the gas regions are formed.

In some embodiments, the formation of gas regions may be used, at least in part, to separate a first portion of the material structure from a second portion of the material structure. In one set of embodiments, the first portion (e.g., 80 in FIG. 1D) may comprise active region 20 while the second portion (e.g., 90 in FIG. 1D) may comprise at least part of substrate 30. In some embodiments, the separation of the material structure into first and second portions may be performed as part of a layer transfer process. In FIG. 1D, the active region 20 is shown attached to handle wafer 70, while a portion (e.g., at least part of a substrate) of the original material structure 10 is shown detached from the portion comprising the active region.

In some embodiments, the exposed surface(s) of the portions formed from the material structure may be cleaned, polished, etched and/or otherwise processed. For example, when a substrate is separated from an active region, the newly formed substrate surface may be cleaned, polished, and/or otherwise processed before using the substrate in another fabrication process. Such an approach can be used to reclaim expensive substrates, such as those comprising bulk GaN, bulk AlN, sapphire, and diamond, among others. As another example, the newly exposed surface of the portion comprising the active region may be cleaned, polished, and/or otherwise processed before being incorporated into a final device structure.

In some embodiments, upon layer transfer, the transferred portion of material structure 10 can be annealed to reduce any potential damage caused by ion implantation through the active region. In some embodiments, annealing involves heating the transferred structure at an annealing temperature (e.g., greater than about 500 degrees C., greater than about 600 degrees C., greater than about 700 degrees C., greater than about 800 degrees C., greater than about 900 degrees C.) for an annealing time (e.g., greater than about 1 minute, greater than about 5 minutes, greater than about 15 minutes).

In some embodiments, the surface of the material structure through which ions are implanted may include a patterned mask. As shown in FIG. 2A, material structure 10 includes patterned mask 210 disposed on surface 50. The mask may comprise any suitable material. Mask materials may be deposited using a variety of methods such as, for example, chemical vapor deposition (e.g., MOCVD), sputtering, among others.

Any suitable pattern of features may be formed in the mask. In one set of embodiments, the pattern formed in the mask may be similar to any of the patterns associated with the LED devices discussed below. As an example, the pattern of the mask may be similar to a pattern suitable for forming a photonic lattice, as described further below. For example, the pattern in the mask may include features having a size of less than a micron, or less than 750 nm, or less than 500 nm, or less than 250 nm. The mask pattern may be formed using any suitable technique including, but not limited to reactive ion etching (e.g., with a substantially chemically etching component), physical etching, and wet etching.

During implantation, the mask layer may partially block the ion beam. Not wishing to be bound by any theory, the ions that interact with the mask may form a concentration peak at a shallower depth in the bulk of the material structure than the ions that do not interact with the mask. Thus, the implant depth of the ions may vary across the structure according to a pattern.

After the implantation step, the mask layer may be removed from surface 50 using any suitable method (e.g., selective etching). In some cases, material structure 10 may be bonded to handle wafer 70, as shown in FIG. 2B. The material structure and handle wafer may be bonded using methods known in the art including, for example wafer bonding (e.g., anodic bonding, fusion bonding, etc.), glass frit bonding, among others. An exemplary illustration of the resulting wafer bonded pair is shown in FIG. 2C.

As described above in connection with the embodiment in FIGS. 1A-1D, gas bubbles may be generated from the implanted ions. These bubbles are also formed at various depths generally corresponding to the pattern. Thus, when portions 80, 90 are separated, respective surface(s) 82, 92 of the portions may be textured, for example also corresponding to the pattern, as shown in FIG. 2D. In some embodiments, this technique can allow for the formation of a surface having a dielectric constant that varies according to a pattern (e.g., a photonic lattice) on the surface of a light-emitting device (e.g., LED, laser diode). Suitable photonic lattice patterns have been described in, for example, U.S. Pat. No. 6,831,302 which is incorporated herein by reference in its entirety. Similar masking approaches can be used to perform nano-patterning on the surface of the ion-cut layers for improved epitaxial regrowth.

In some embodiments, a submount may be formed on a separated portion (e.g., the portion that comprises active region 20) of material structure 10. An exemplary embodiment is illustrated in FIGS. 3A-F. FIGS. 3A-D illustrate a process including steps similar to that in FIGS. 1A-D. In some embodiments, the surface of the transferred layer can be polished to remove any roughness introduced. In other embodiments, the roughness may be retained so as to enhance light extraction of the finished light-emitting device. In FIG. 3E, submount 300 is formed on portion 80 after it has been separated from portion 90. The submount may be used to facilitate handling and/or to have functional attributes the resulting device such as heat removal.

Methods for forming the submount can include, for example, deposition, sputtering, evaporation, electro-formation, electro-deposition, electro-plating, up-plating, and/or any other suitable process. The submount may comprise any suitable material including, for example, metals (e.g., copper, tungsten, silver, gold, aluminum, or any other suitable metal or metal alloys and/or combinations thereof), silicon, sapphire, etc. In some embodiments, the handle wafer can include one or more layers of material.

In some cases, portion 80 may include active region 20, which may, in some embodiments comprise one or more light-emitting device layers. In some embodiments, ions may be implanted through active region 20, as previously described in reference to FIGS. 1A-D. The one or more light-emitting device layers that may be layer transferred can include active region layers (e.g., quantum wells). Alternatively, or additionally, a seed epitaxial layer can be transferred, and a desired light-emitting device structure (e.g., including active region layers, such as quantum wells and/or n-doped and/or p-doped layer(s)) can be epitaxially grown. In some cases, as illustrated in FIG. 3F, handle wafer 70 may be removed from portion 80 to leave final structure 310. The handle wafer may be removed using any technique known in the art including, by not limited to, selective etching, lift-off processing, etc.

In some embodiments, any two materials that are bonded (e.g., material structure 10 and handle wafer 70, portion 80 and submount 300, etc.) may possess substantially similar thermal expansion coefficients. For example, in some embodiments the substrate can be a poly-crystalline AlN wafer or a poly-crystalline GaN wafer. In some embodiments, the substrate may include a bulk GaN substrate, a bulk AlN substrate, or a GaN-on-sapphire substrate. In some embodiments, a poly-crystalline AlN substrate can be used and have a thermal expansion coefficient of about $4.5 \times 10^{-6}$ $K^{-1}$. In some embodiments, the donor wafer can include a bulk GaN substrate (which can support light-emitting device layers) and can have thermal expansion coefficients of $\alpha_{ort} = \alpha_c = 3.2 \times 10^{-6}$ $K^{-1}$ and $\alpha_{\parallel} = \alpha_a = 5.6 \times 10^{-6}$ $K^{-1}$.

In some embodiments, a method is provided to transfer an active region onto a handle wafer or a submount wafer while precisely controlling the thickness of a top layer on the active region (e.g., n-side layers, for example an n-doped GaN layer). In some embodiments, ions are implanted through a p-side layer (n-side layer) of a light-emitting multi-layer structure. This can allow for the wafer bonding of the p-side (n-side) layer to a handle wafer (e.g., submount, such as a metal submount) and layer transfer of the active material region (e.g., quantum wells). In some embodiment, since implantation occurs through the p-side (n-side) layer and through the quantum wells, the entire light-emitting structure can be transferred onto the handle wafer or the submount wafer. Such a process can allow for the precise control of the thickness of the top layer (e.g., n-side or p-side) over the active region. For example, the thickness of the top layer over the active region can be less than about 1 micron (e.g., less than about 0.5 microns, less than about 0.25 microns, less than about 0.1 microns). In some embodiments, etch stop layers can be present within the top layer and above the active layers, such that after the formation of gas regions and layer transfer, a selective etch can be used to precisely remove top layer material that is present above the etch stop layer. Such a process can allow for ultra-thin top layer (e.g., n-side or p-side) thickness of less than about 100 nm (e.g., less than 75 nm, less than about 50 nm, less than 25 nm, less than 10 nm).

Figure 2:
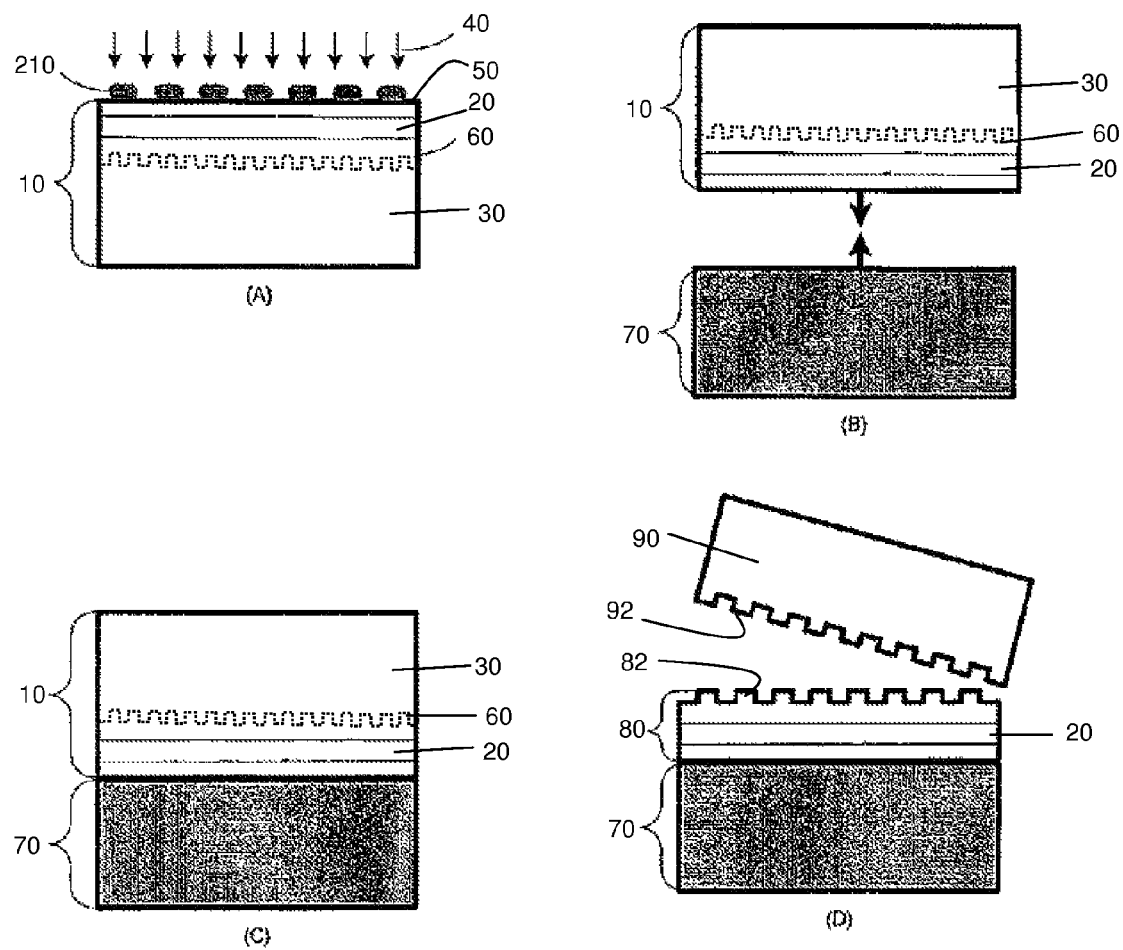
FIGS. 2A-D schematically illustrate a method according to some embodiments.
Figure 3:
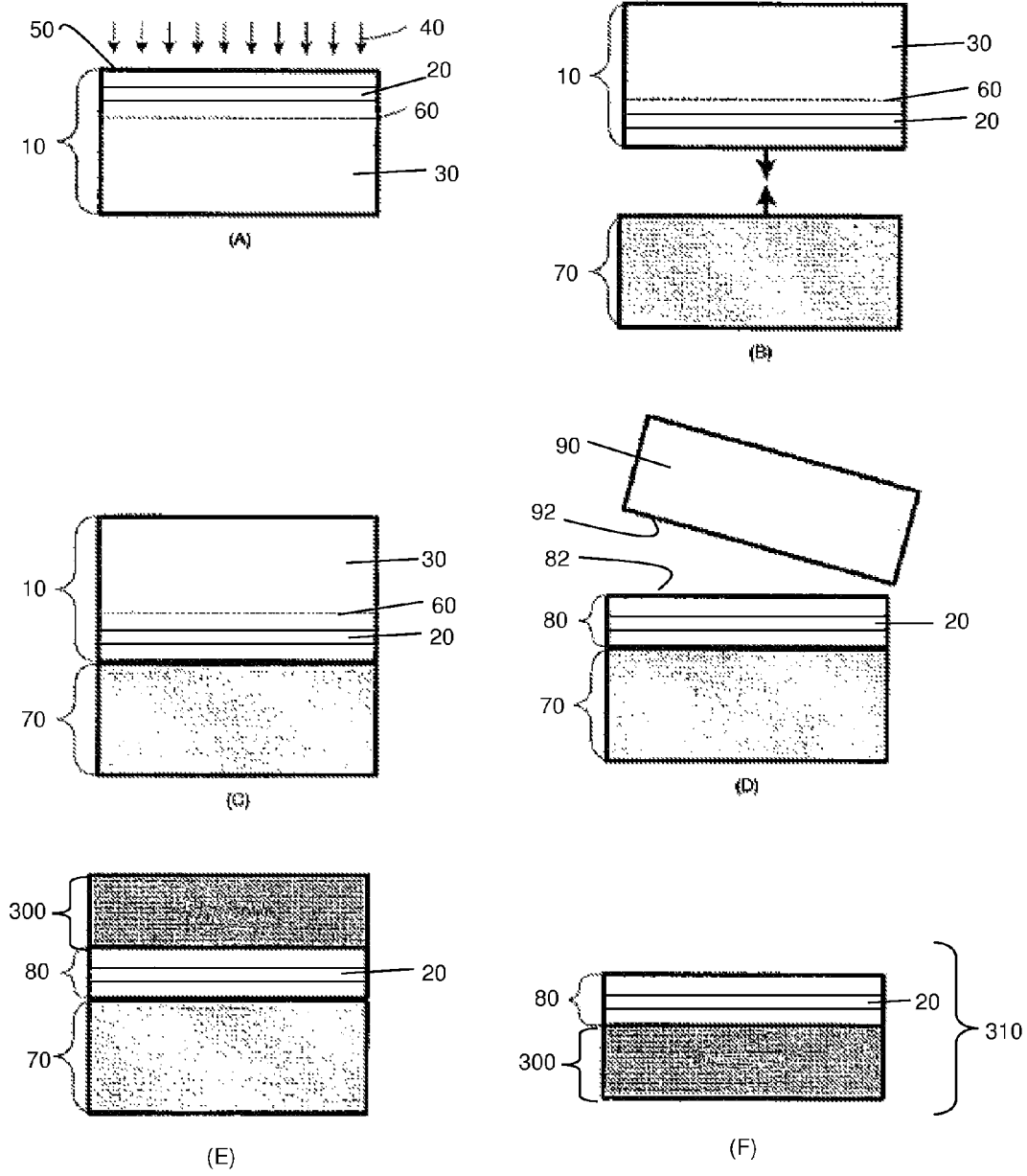
FIGS. 3A-F schematically illustrate a method according to some embodiments.
Figure 4:
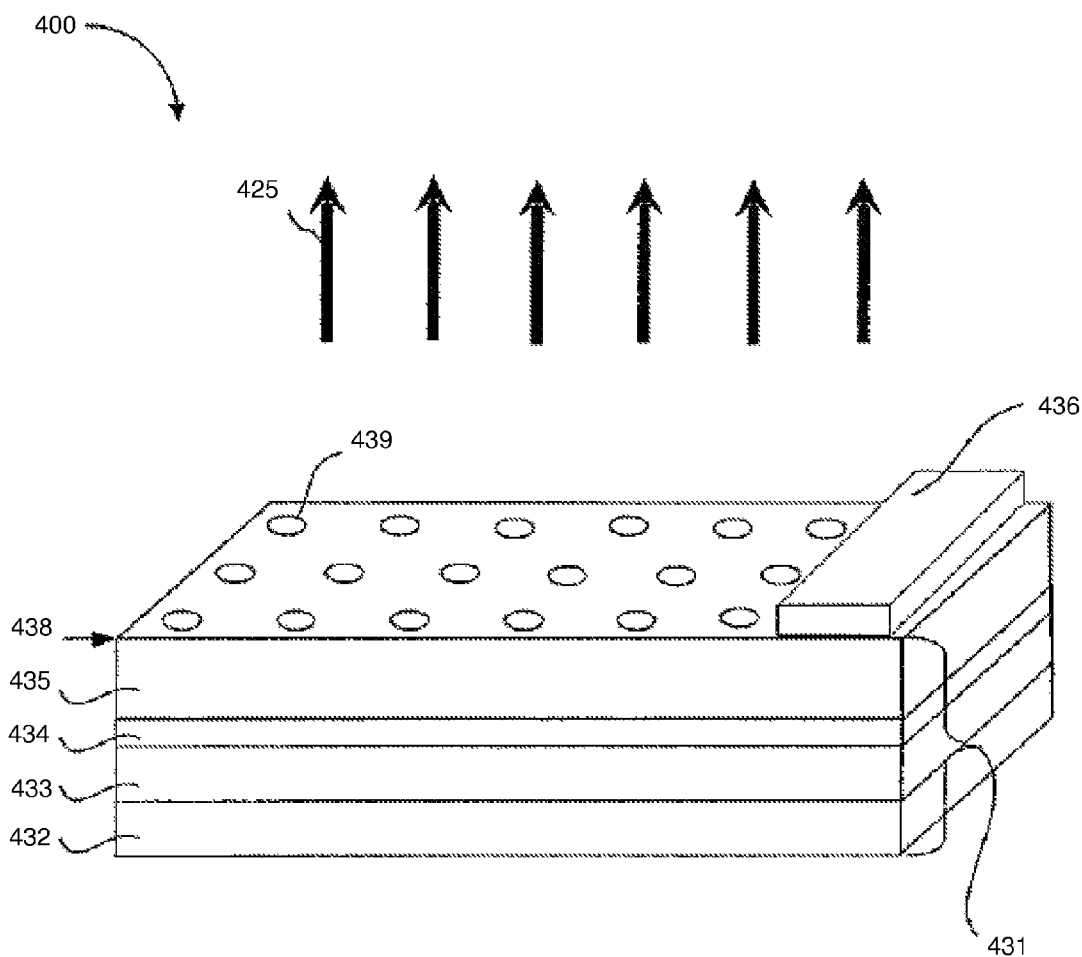
FIG. 4 is a schematic illustration of a light-emitting diode according to some embodiments.

In some embodiments, the light-emitting structures formed in the methods shown in FIGS. 1-3 are further processed to form light-emitting devices such as LEDs. FIG. 4 illustrates a light-emitting diode (LED) which may be one example of a light-emitting device, in accordance with one embodiment. It should be understood that various embodiments presented herein can also be applied to other light-emitting devices, such as laser diodes, and LEDs having different structures (such as organic LEDs, also referred to as OLEDs). LED 400 shown in FIG. 4 comprises a multi-layer stack 431 that may be disposed on a support structure (not shown). The multi-layer stack 431 can include an active region 434 which is formed between n-doped layer(s) 435 and p-doped layer(s) 433. The stack can also include an electrically conductive layer 432 which may serve as a p-side contact, which can also serve as an optically reflective layer. An n-side contact pad 436 may be disposed on layer 435. Electrically conductive fingers (not shown) may extend from the contact pad 436 and along the surface 438, thereby allowing for uniform current injection into the LED structure.

It should be appreciated that the LED is not limited to the configuration shown in FIG. 4, for example, the n-doped and p-doped sides may be interchanged so as to form a LED having a p-doped region in contact with the contact pad 436 and an n-doped region in contact with layer 432. As described further below, electrical potential may be applied to the contact pads which can result in light generation within active region 434 and emission (represented by arrows 425) of at least some of the light generated through an emission surface 38. As described further below, holes 439 may be defined in an emission surface to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 435 can include a silicon-doped GaN layer (e.g., having a thickness of about 4000 nm thick) and/or the p-doped layer(s) 433 include a magnesium-doped GaN layer (e.g., having a thickness of about 40 nm thick). The electrically conductive layer 432 may include a silver layer or composite alloy (e.g., having a thickness of about 100 nm), which may also serve as a reflective layer (e.g., that reflects upwards any downward propagating light generated by the active region 434). Furthermore, although not shown, other layers may also be included in the LED; for example, an AlGaN layer may be disposed between the active region 434 and the p-doped layer(s) 433. It should be understood that compositions other than those described herein may also be suitable for the layers of the LED.

As a result of holes 439, the LED can have a dielectric function that varies spatially according to a pattern. Typical hole sizes (e.g., diameters) can be less than about one micron (e.g., less than about 750 nm, less than about 500 nm, less than about 250 nm) and typical nearest neighbor distances between holes can be less than about one micron (e.g., less than about 750 nm, less than about 500 nm, less than about 250 nm). Furthermore, as illustrated in the figure, the holes 439 can be non-concentric.

The dielectric function that varies spatially according to a pattern can influence the extraction efficiency and/or collimation of light emitted by the LED. In some embodiments, a layer of the LED may have a dielectric function that varies spatially according to a pattern. In the illustrative LED 400, the pattern is formed of holes, but it should be appreciated that the variation of the dielectric function at an interface need not necessarily result from holes. Any suitable way of producing a variation in dielectric function according to a pattern may be used. For example, the pattern may be formed by varying the composition of layer 435 and/or emission surface 438. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. As used herein, peak wavelength refers to the wavelength having a maximum light intensity, for example, as measured using a spectroradiometer. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference in its entirety). In some embodiments, a device may include a roughened surface. The surface roughness may have, for example, a root-mean-square (rms) roughness about equal to an average feature size which may be related to the wavelength of the emitted light.

In certain embodiments, an interface of a light-emitting device is patterned with holes which can form a photonic lattice. Suitable LEDs having a dielectric function that varies spatially (e.g., a photonic lattice) have been described in, for example, U.S. Pat. No. 6,831,302 B2, entitled "Light emitting devices with improved extraction efficiency," filed on Nov. 26, 2003, which is herein incorporated by reference in its entirety. A high extraction efficiency for an LED implies a high power of the emitted light and hence high brightness which may be desirable in various optical systems.

It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. Patent Publication No. 20070085098, entitled "Patterned devices and related methods," filed on Mar. 7, 2006, which is herein incorporated by reference in its entirety.

Light may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned surface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high light output power. As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total optical power divided by the emission area. In some embodiments, the total power flux is greater than 0.03 Watts/mm$^2$, greater than 0.05 Watts/mm$^2$, greater than 0.1 Watts/mm$^2$, or greater than 0.2 Watts/mm$^2$. However, it should be understood that the LEDs used in systems and methods presented herein are not limited to the above-described power and power flux values.

In some embodiments, the LED may be associated with one or more wavelength converting regions. The wavelength converting region(s) may include one or more phosphors and/or quantum dots. The wavelength converting region(s) can absorb light emitted by the light-generating region of the LED and emit light having a different wavelength than that absorbed. In this manner, LEDs can emit light of wavelength (s) (and, thus, color) that may not be readily obtainable from LEDs that do not include wavelength converting regions. In some embodiments, one or more wavelength converting regions may be disposed over (e.g., directly on) the emission surface (e.g., surface 438) of the light-emitting device.

As used herein, an LED may be an LED die, a partially packaged LED die, or a fully packaged LED die. It should be understood that an LED may include two or more LED dies associated with one another, for example a red light-emitting LED die, a green light-emitting LED die, a blue light-emitting LED die, a cyan light-emitting LED die, or a yellow light-emitting LED die. For example, the two or more associated LED dies may be mounted on a common package. The two or more LED dies may be associated such that their respective light emissions may be combined to produce a desired spectral emission. The two or more LED dies may also be electrically associated with one another (e.g., connected to a common ground).

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed.

What is claimed is:

1. A method comprising:
    providing a material structure comprising an n-type layer, a p-type layer, and a light-generating layer between the n-type layer and the p-type layer;
    implanting ions in the material structure;
    forming gas regions from the ions implanted in the material structure; and
    separating a first portion of the material structure comprising the entire light-generating layer from a second portion of the material structure, in part, due to the formation of the gas regions.

2. The method of claim 1, wherein the implanting ions step comprises implanting ions through the n-type region, the p-type region, and the light-generating region.

3. The method of claim 2, wherein the ions are selected from the group consisting of hydrogen ions, helium ions, and argon ions.

4. The method of claim 1, wherein the material structure comprises a substrate.

5. The method of claim 1, wherein the first portion comprises the n-type region and the p-type region.

6. The method of claim 1, wherein the second portion comprises at least a portion of a first substrate.

7. The method of claim 1, wherein the gas regions are formed by heating the material structure.

8. The method of claim 1, wherein, after separation, a surface of the first portion is textured.

9. The method of claim 1, wherein, after separation, the first portion is further processed to form a light-emitting diode.

10. The method of claim 1, further comprising forming a patterned mask on a surface of the material structure prior to implanting.

11. The method of claim 10, wherein the ions implanted into the material structure that pass through the patterned mask are implanted at different depths than ions implanted into the material structure that do not pass through the patterned mask.

12. The method of claim 1, wherein the material structure comprises a plurality of light generating layers.

13. The method of claim 6, wherein the first portion comprises a second substrate different from the first substrate.

14. The method of claim 8, wherein the textured surface comprises a patterned surface.

15. The method of claim 14, wherein the patterned surface comprises a photonic lattice.

* * * * *